United States Patent [19]
Kunisawa et al.

[11] Patent Number: 5,776,636
[45] Date of Patent: Jul. 7, 1998

[54] METHOD OF MANUFACTURING LIGHT-TRANSMITTING PLATES

[75] Inventors: Toshitaka Kunisawa; Osamu Shinji, both of Kitakanbara-gun; Kouzo Yasuda, Kashima-gun; Toshiyuki Yoshikawa, Tokyo, all of Japan

[73] Assignee: Kuraray Co., Ltd., Kurashiki, Japan

[21] Appl. No.: 661,320

[22] Filed: Jun. 13, 1996

[30] Foreign Application Priority Data

Jun. 16, 1995 [JP] Japan ................................. 7-149949
Dec. 12, 1995 [JP] Japan ................................. 7-322770

[51] Int. Cl.$^6$ ................................................. G03F 9/00
[52] U.S. Cl. ................................................. 430/5; 430/6
[58] Field of Search ................................................. 430/5, 6

[56] References Cited

U.S. PATENT DOCUMENTS 5,384,658   1/1995   Ohtake et al. ........................... 359/707

*Primary Examiner*—Mark Chapman
*Attorney, Agent, or Firm*—Oblon, Spivak, McClelland, Maier, & Neustadt, P.C.

[57] ABSTRACT

The present invention includes the steps of forming a stamper with a fine and delicate relief pattern formed thereon by forming a photo resist layer on a flat substrate, exposing the photo resist, developing the exposed photo resist, metallizing and electroforming the surface of the photo resist, and of injection molding the light-transmitting plate using said stamper.

7 Claims, 4 Drawing Sheets

METHOD OF MANUFACTURING LIGHT-TRANSMITTING PLATES

BACKGROUND OF THE INVENTION

1. (Field of the Invention)

The present invention relates to a method of manufacturing a light-transmitting plate used as the backlight of liquid crystal display device, etc., and more particularly, to an efficient method of manufacturing light-transmitting plates having a rugged surface for scattering or reflecting light rays.

2. (Disclosure of the Prior Art)

A light-transmitting plate used as the backlight of a surface illumination device such as liquid crystal display device generally has an emergent plane and a plane disposed opposite thereto. On at least one of such planes, there are provided elements that can change the angle of light rays passing through or being reflected by the light-transmitting plate (hereinafter referred to as "deflection element). The incident light entering the light-transmitting plate from an end face emerges from the emergent side by being changed of its direction by said emergent plane or the plane opposite the same. Alternatively, the light undergoes total reflection by these planes and is propagated within the plate. Here, the distribution density of the deflection elements or the angle of light deflected by said elements is often so determined that the brightness of the emergent light would be uniform over the entire surface of the light-transmitting plate.

To provide deflection elements, (1) the surface of a light-transmitting plate may be coated with a material that scatters or reflects the light, (2) the surface of a light-transmitting plate may be provided with a relief pattern to scatter or reflect the light, or (3) a light-transmitting plate may be dispersed with light-diffusing particles. As for the light-transmitting plate of the type (1), it is a common practice to coat the plate surface with a resin (such as paint) containing light diffusing particles or a resin having a refractive index which is different from that of the material for the plate substrate. The light-transmitting plate of the type (2) may have a surface which is roughened or textured in a regular pattern. Such a regular pattern may be lines or dots in the plan view, and rectangular, trapezoidal, triangular or partly circular in the sectional view. The light-transmitting plate of the type (3) contains, in many cases dispersed in its substrate material, light diffusing particles of resin or glass having a refractive index which is different from that of the substrate material. In the following description, an aggregate of deflection elements with graded distribution densities determined according to a given relation to make uniform the distribution of luminance on the emergent plane of the light-transmitting plate is collectively referred to as "deflection pattern".

The light-transmitting plate of the type (1) is generally manufactured by a screen printing method, while the plate of the type (2) is manufactured by etching, sand blast or machining. Mass reproduction of light-transmitting resin plate is also possible by injection molding, etc. using a stamper which is provided with deflection elements by machining. The light-transmitting plate of the type (3) is generally manufactured by admixing glass beads into the resinous material constituting the plate substrate and by molding the mixture into a plate.

As for the method of manufacturing the light-transmitting plate of the type (1), characteristics of the screen printing make it difficult to reproduce fine configuration of the pattern; in fact, it is practically impossible to provide deflection elements with the width or pitch as fine as 100 microns or less (c.f. Japanese Patent Application Laid-open No. Hei 3-68923). Thus, if the deflection elements are to be provided at a distribution density according to a given relation, the pitch of a deflection element must be set at 100 micron or more as the lower limit, possibly leading to an upper limit pitch of 1 mm or more. In such a case, the deflection pattern itself is recognized as a visible pattern because the pitch and the width of the deflection element is great, and this fails to give uniform lighting. Interference between the deflection elements and the prism sheet or the pixel of the LC display device is very likely to cause moire pattern because of their pitches, which in turn may degrade the image quality on the display device (c.f. Japanese Patent Application Laid-open No. Hei 5-257144 or Hei 5-313017). In other words, the screen printing method may fail to produce light-transmitting plates having a deflection pattern of desired optical performance.

As regards the method of manufacturing a light-transmitting plate of the type (2), it is generally difficult to perform machining of very fine deflection elements at a high precision, and desired optical performance is often unobtainable. As for the case where a deflection pattern is machined on a stamper for use in injection molding of the light-transmitting plate, it is difficult to machine a large number of very fine deflection elements having accurate design configuration at a distribution density determined based on a given relation because of the limit in the positioning precision of the machining tool or wear of the tool, particularly if the light-transmitting plate has a large surface area. If the machining precision is unsatisfactory, design characteristics of deflection or the high luminance which is the primary requirement in the performance of a backlight is not secured. Because the minimum dimension that can be machined is limited, one deflection element inevitably results in more than several hundred microns in size. However, if each of the deflection elements measures more than several hundred microns, the resultant deflection pattern may appear as unevenness in the luminance, similarly as in the case of the plate of the type (1).

As for the method of producing the plate of the type (3), it is extremely difficult to disperse the light diffusing particles into the substrate with high reproducibility even if an attempt is made to provide the deflection elements at a distribution density determined based on a given relation.

OBJECTS AND SUMMARY OF THE INVENTION

The present invention has been contrived to solve the problems mentioned above, and aims at providing an efficient method of manufacturing high precision light-transmitting plates suitable for use as a backlight having a large area and uniform luminance.

The method of manufacturing light-transmitting plates according to the present invention includes the steps of forming a photo resist layer on a flat substrate, exposing the photo resist, developing the photo resist thus exposed, and metallizing and electroforming the surface of the photo resist to whereby prepare a stamper having very minutely textured surface, from which the light-transmitting plates are molded.

BRIEF DESCRIPTION OF THE DRAWINGS

The present invention will be more clearly understood from the description of the preferred example taken in conjunction with the accompanying drawings. It should be noted, however, that the example and the drawings are intended merely for illustrative and explanatory purposes and should not be construed as limiting the scope of the present invention. The scope of the invention is defined by the appended claims.

DETAILED DESCRIPTION OF THE INVENTION

Figure 3A:
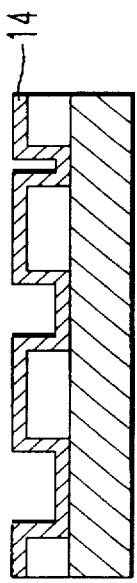
FIG. 3 explains the method of manufacturing stampers of light-transmitting plates.
Figure 3B:
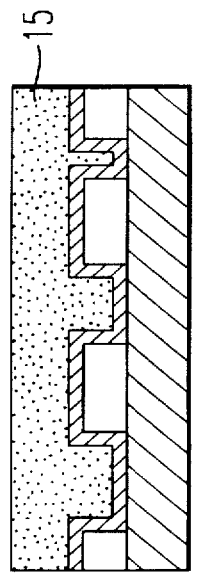

The method of manufacturing light-transmitting plates according to the present invention will now be described in more detail referring to FIG. 3. As a substrate 10 shown in FIG. 3a, glass or metal plates with high degree of flatness achieved by polishing, etc. are commonly used. As shown in FIG. 3a, a photo resist layer 9 is formed on the substrate. The photo resist layer may be formed in any manner so long as uniform thickness can be formed over the entire area, such as by spin coating, dip coating, roll coating, electrodeposition, or by pasting the photo resist film while heating.

The height of the deflection element is determined by the thickness of the photo resist layer. It is important that the deflection element should have the design height in order to achieve high luminance, prevent moire pattern formation or prevent the deflection pattern from being recognized as a pattern of graded luminance. However, the deflection element is generally extremely high compared to the usual pit height of optical disks such as LDs and CDs which is about 0.1 micron. This makes it difficult to form a photo resist with thickness that is suitable for forming deflection elements. To provide deflection elements, it is preferable to form a 5 to 30 micron thick photo resist layer by spin coating the photo resist with the viscosity in the range of from 200 to 1200 cps. It is also preferable to paste a photo resist in the form of film (what is known as dry film resist) by heating the same to create a photo resist layer with the thickness of 20 to 50 micron. There are positive and negative photo resists, and either of them may be used in the present invention. In case the photo resist is exposed using a photo mask, two different stampers provided with deflection element patterns in inverted relation with each other can be prepared from one photo mask by using a positive and a negative photo resists. Examples of positive photo resist include PMER P-AR900, PMER P-AR300 series by Tokyo Ohka Kogyo Co., Ltd. Examples of negative photo resist include BMER C-1000 by Tokyo Ohka Kogyo Co., Ltd. Examples of dry film resist include VANX A-900, A-800, A-600 series and U-120 by Fuji-Hunt Electronics Technology Co., Ltd., and ORDYL 430T and ORDYL -405 by Tokyo Ohka Kogyo Co., Ltd. may be used.

It is possible to adjust the luminance distribution in the light-transmitting plate by varying the layer thickness of the photo resist applied on the substrate. If the uniformity of luminance (obtained by dividing the minimum luminance with the maximum) is not sufficiently high in the light-transmitting plate in trial production using the present invention method, the height of the deflection element can be easily modified by changing the film thickness of the photo resist, enabling production of light-transmitting plates with higher uniformity of luminance without the need to modify the design of the deflection element. Thus, optimization of the plate dimensions can be efficiently carried out at the stage of trial production of the light-transmitting plate, and minute and fine adjustment of the dimensions can be easily conducted at the stage of mass production.

The deflection pattern is then exposed on the photo resist layer applied on the substrate. It is possible to expose the pattern all at once over the entire surface using parallel light beams irradiated on the photo resist layer through an overlaid photo mask 11. It is also possible to directly draw the pattern on the photo resist using optical beam. In the former method, the deflection pattern is drawn on the photo mask. This is advantageous when plural stampers of the same pattern are prepared, while the latter method is suitable for the case where only one stamper of the same pattern is prepared at a time. Deflection patterns may be in any form such as dots and lines. When a photo mask is used, it may sometimes happen that the width of the pattern on the photo mask and the width of the deflection element developed in the photo resist may not coincide with each other. If this happens, the width of the photo mask pattern should be determined by taking into account the possible change in the width of the deflection element after development, so that the change can be corrected. Ultraviolet rays are usually used in the exposure process using photo mask; more preferably, an apparatus capable of emitting light rays that are as close to parallel as possible should be used. Laser beams or electron beams are typically used to draw patterns directly on the photo resist.

Figure 4B:
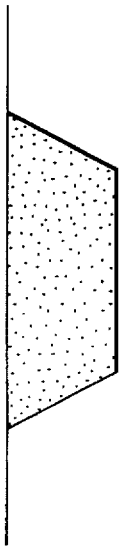
FIG. 4 is an enlarged sectional view to show an example of the deflection element.
Figure 4D:
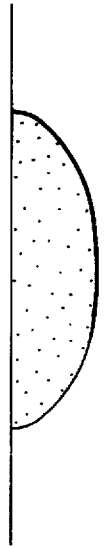
Figure 4A:
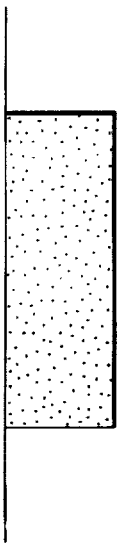
Figure 4C:

In the exposure method mentioned above, the sectional configuration of the deflection element is usually rectangular (FIG. 4a) or trapezoidal (FIG. 4b). In the case of mask exposure method, the inclination of the sides or the curvature at the corners of a deflection element having a trapezoidal section can be suitably modified by allowing an extremely small interval between the photo mask and the resist at the time of exposure to whereby enlarge the boundary areas between the exposed and unexposed portions (FIG. 4c). By casting beams diagonally from above the substrate on either the right or the left side thereof, it is possible to form a deflection element having a laterally asymmetrical section where the angle of one of the sides with the bottom plane of the element is different from that of the other side. It is also possible to form a deflection element having two types of sectional configuration if the substrate covered with the photo mask is exposed with half the predetermined amount of light and then exposed again with said half amount after turning the substrate together with the photo mask for 180 degree.

Figure 4E:

In case patterns are drawn directly on the substrate using an optical beam, it is possible to modify said inclination of the sides or the curvature in the trapezoidal section of the deflection element by shifting the focal point of the optical beam spot by an extremely small margin (i.e. by blurring the focal point)(FIG. 4c). By selecting appropriate conditions, a section in the form of a sine wave (FIG. 4e) can also be obtained. Thus, by suitably settling the exposure conditions, performance of the deflection element can be regulated, and the transferability of the pattern at the time of molding can be improved. Said adjustment of the sectional configuration is also possible by varying such conditions as the concentration of the developing agent, and development temperature and duration. It is further possible to form a deflection element having a section which is a portion of a circle (FIG. 4d) by adding the baking step between the developing and metallizing of the surface to change the sectional configuration of the photo resist remaining after the development process.

Figure 3C:
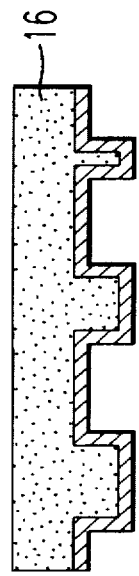
Figure 3D:
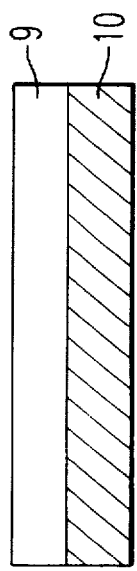

In case a positive photo resist is used in the present invention, the exposed portions 12 of the photo resist layer are removed by the development process, with the remaining unexposed portions 13 forming the deflection pattern as shown in FIG. 3c. Conversely, with a negative photo resist, the unexposed portions are removed and the exposed portions are left. Development may be carried out by using a prescribed developing agent and by such steps as dipping, paddling or showering.

Figure 3E:
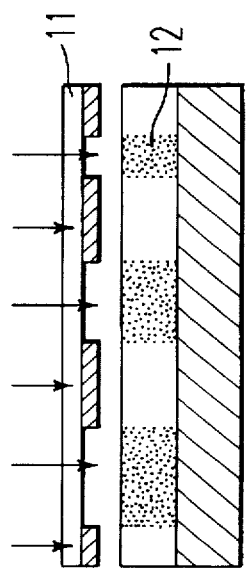
Figure 3F:
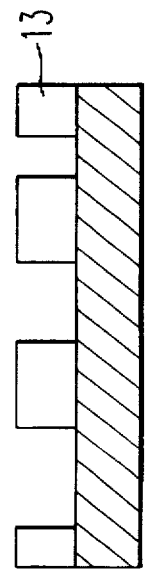

After the development process, a metal layer is formed on the resist surface by such methods as vacuum deposition, sputtering, or chemical plating (FIG. 3d) for metallization, and a stamper 16 is formed by electroforming (FIGS. 3e and 3f). If necessary, it is possible to reproduce a stamper with a deflection pattern which is the inversion of the original stamper pattern by stripping off the pattern therefrom and repeating the electroforming process. It is still possible to obtain plural stampers with a relief pattern which is identical with the original stamper by using the stamper thus reproduced.

If the stamper surface obtained by electroforming is rugged on the back, polishing is conducted to flatten the same, and a stamper for molding is obtained by machining the outer form of the stamper to have the proper dimensions. Light-transmitting plates with a precise transfer of the deflection pattern can be mass produced by injection molding, press molding, 2P (photo-polymer) molding, etc. using the molding stamper thus formed.

The flat surface of the substrate on which a photo resist is to be applied may be subjected to etching or sand blasting to have an irregular structure which is finer than that of the deflection element, applied with a photo resist and then subjected to the treatments mentioned above, so that the very minute relief pattern formed on the substrate may be transferred on the light-transmitting plate to give texture to the top or the bottom surface of the deflection element.

With some of the conventional precision machining techniques such as those using diamond cutting tool, it has been impossible to manufacture deflection elements having highly precise and fine configurations, and this in turn failed to sufficiently improve efficiency in utilizing light. Use of photolithographic technique which is used for forming fine and delicate relief patterns in the production of optical disks and semi-conductors enables production of very fine relief patterns required for the manufacture of light-transmitting plates having highly uniform luminance. According to the present invention, height of the relief pattern formed by the deflection elements in the light-transmitting plate can be controlled by controlling the layer thickness of the photo resist.

An embodiment of a liquid crystal display device using the present invention light-transmitting plate will now be described in more detail.

Figure 2B:
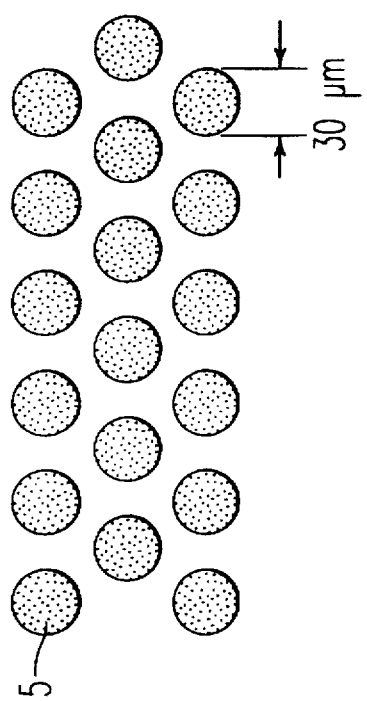
FIG. 2 is a plan view to show an example of a deflection pattern.
Figure 2C:
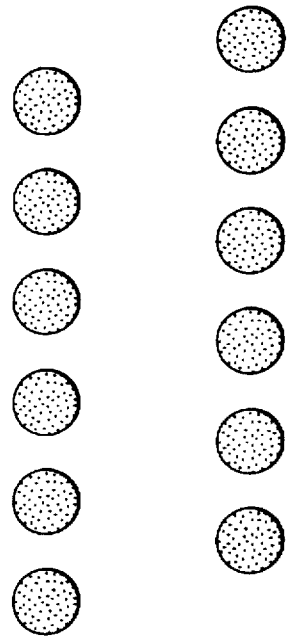
Figure 1:
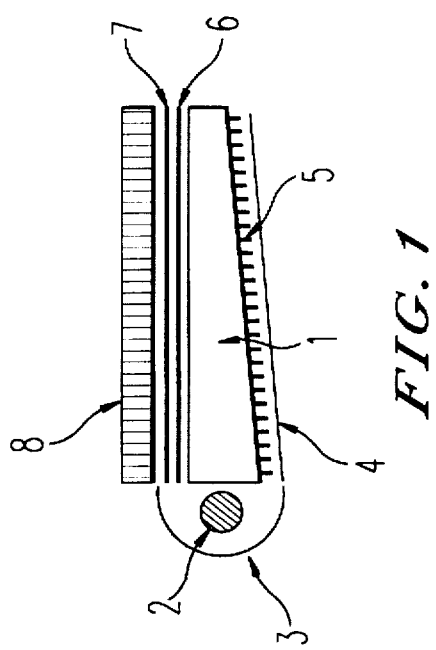
FIG. 1 is a sectional view to show a typical construction of the conventional edge-light type backlight.
Figure 2A:
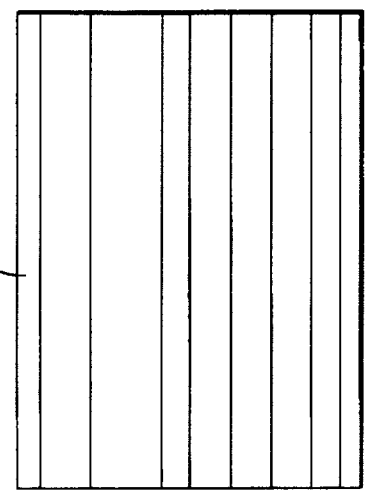

The light-transmitting plate as the backlight of a planar light source device used in liquid crystal display devices comprises a flat emergent plane and a plane opposing said emergent plane and having deflection elements, and functions to deflect the light entering at the end face by means of the deflection element. Typically, a gradient based on a given relation is applied to the distribution density of the deflection elements to achieve uniform luminance distribution over the entire area of the light-transmitting plate. FIG. 1 is a side view of a typical one-lamp, edge-light type backlight and a liquid crystal display device. A light source 2 is a linear lamp, which is positioned at the focal point of a semi-circular or parabolic reflector 3. A transparent material having rectangular cross section is typically used as the light-transmitting plate 1. More recently, plates having tapered section are frequently used to reduce the weight. A diffusion sheet 6 is disposed on the upper face (emergent side) of the light-transmitting plate to uniformly distribute the light rays. A prism sheet 7 is also provided to deflect the light rays toward a substantially perpendicular direction. It is a common practice in recent years to provide two prism sheets in crisscross arrangement in order to improve the luminance in the perpendicular direction. Deflection elements 5 are provided on the bottom face of the light-transmitting plate to allow light rays entering from the end face to be emitted from the upper face. In order to assure uniform amount of light to be emitted from the entire emergent surface from the side closer to the light source as far as to the distal end, there is provided a gradient in the distribution densities of the deflection elements. Generally, the density is smaller on the side closer to the light source while the same is greater on the distal end. Corrections are also made to obtain uniform luminance over the entire surface by modifying the distribution density of the deflection elements at certain points. A reflection sheet 4 is provided on the bottom face of the light-transmitting plate to reflect the downward light rays back toward the light-transmitting plate. A backlight having the above construction is placed behind a liquid display panel 8. FIG. 2 shows an example of distribution of the deflection elements in graded densities (FIG. 2a). The density is higher (FIG. 2b) on the side opposite the light source (at the top in the figure) while it is smaller (FIG. 2c) on the side of the light source (at the bottom in the figure).

Figure 5:
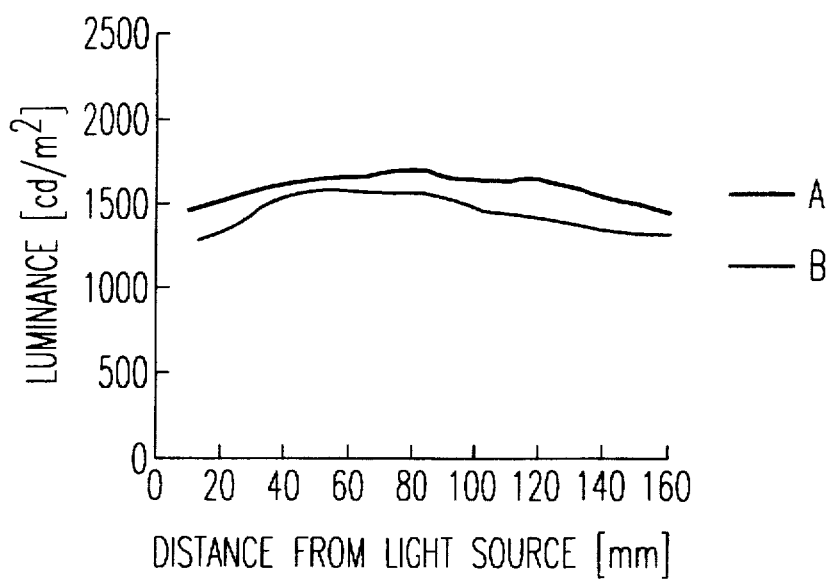
FIG. 5 is a graph to show the result A of luminance measurement on the light-transmitting plate prepared by one example of the present invention method as compared with the result B of the conventional light-transmitting having deflection elements that are dot-printed.

The method of manufacturing light-transmitting plates according to the present invention will now be described in more detail. Explanation is made of a case where a glass substrate, a positive photo resist and a photo mask are used. A positive photo resist (viscosity of 900 cps) for forming a 20 micron thick layer was applied by spin coating on a circular glass substrate measuring 350 mm in diameter and 5 mm in thickness. After pre-baking, a photo mask measuring 10.4 inches diagonally and provide d with a deflection pattern having deflection elements distributed in graded densities was placed over the substrate and exposed using a mask exposure device for the light amount prescribed by the photo resist manufacturer. Using a conventional method, an emulsion in which particles of silver chloride are dispersed was applied on a glass plate, and a pattern image prepared by CAD system was reduced in scale and printed on the glass plate utilizing the photographic principle to prepare the photo mask. A prescribed developing agent suitable for the positive photo resist was used for the dipping process to prepare a master provided with a relief pattern of deflection elements. The section of the master at portions where the photo resist remained after development was substantially rectangular or trapezoidal. A conductive nickel layer was provided on the surface of the master for the thickness of about 10 nm by sputtering. A nickel layer of 300 micron thickness was formed by electroforming, and the residual photo resist on the surface was removed. A stamper was obtained after polishing the back face, trimming the outer profile, etc. Light-transmitting plates provided on one side with a very fine and delicate relief pattern of deflection elements were obtained by injection molding using the stamper. The light-transmitting plate measures 10.4 inches long diagonally, 3.0 mm thick at the end on the light incident side, and 1.1 mm thick at the opposite end. To evaluate the performance of the plate, a white scattering sheet, a cold cathode tube of 3.0 mm diameter, a diffusion sheet and a prism sheet were used. A luminance meter (Type BM-7 manufactured by TOPCON Co., Ltd.) was used at the measurement distance of 500 mm and the angle of 1 degree. FIG. 5 is a graph to compare the luminance distribution between the present invention light-transmitting plate (indicated as A in the figure) and a conventional light-transmitting plate provided with dots of white scattering elements by the screen printing method (indicated as B in the figure). It is clear from FIG. 5 that the present invention light-transmitting plate produces high luminance.

Figure 6:
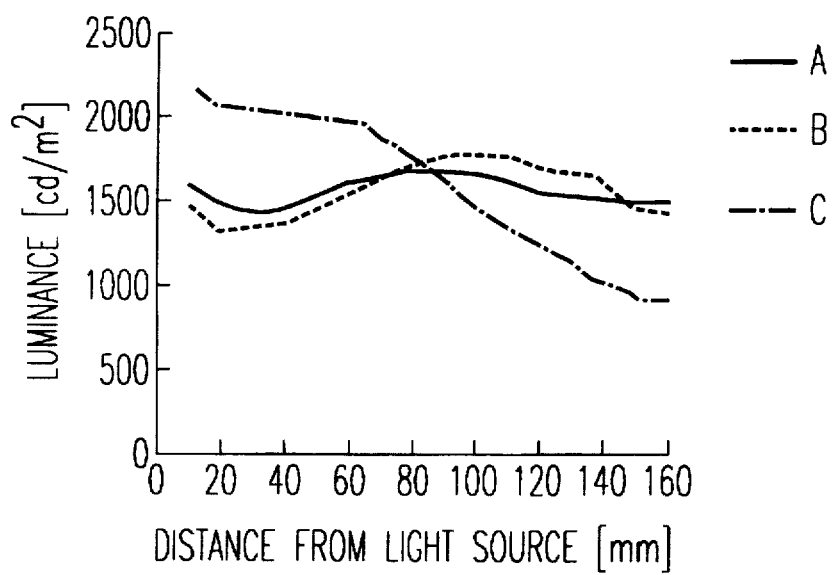
FIG. 6 is a graph to show the result of luminance measurement of the plate according to the present invention method wherein the layer thickness of the photo resist is varied.

The relation between the layer thickness of the photo resist and the uniformity of luminance as observed in the above mentioned embodiment will now be discussed. FIG. 6 shows the result of luminance distribution measurement of the light-transmitting plate (the measurement apparatus and the method are the same as those mentioned above). The luminance distribution when the photo resist is 12 micron thick is indicated as A, B when the thickness is 10 micron and C when the thickness is 17 micron respectively in FIG. 6. The uniformity of luminance as obtained based on the measurement results was low at 74% when the layer thickness was 10 micron, as indicated by B in FIG. 6, while the same was improved to 84% when the layer thickness of the photo resist was 12 micron. As the layer thickness of the photo resist was increased to 17 micron, the uniformity of luminance deteriorated to 43% as indicated by C in the figure.

What is claimed is:

1. A method of manufacturing light-transmitting plates comprising:

forming a photo resist layer on a flat substrate;

exposing the photo resist so as to form a pattern of deflection elements in the photo resist;

developing the pattern of deflection elements in the exposed photo resist so as to form a topographical relief in the photo resist corresponding to the pattern of deflection elements, said topographical relief having a particular height;

providing the photo resist topographical relief pattern corresponding to the pattern of deflection elements with a metal layer and electroforming the topographical relief pattern to form a stamper; and molding the light-transmitting plates from said stamper so that the light-transmitting plates are provided with a relief pattern of deflection elements having the particular height, said deflection elements of said particular height providing transmitted light with uniform illuminance without recognizable patterns through each of the molded light-transmitting plates.

2. The method of manufacturing light-transmitting plates as claimed in claim 1 wherein a photo resist of 200 to 1200 cps in viscosity is used to form a 5 to 30 micron thick photo resist layer by spin coating.

3. The method of manufacturing light-transmitting plates as claimed in claim 1 wherein a photo resist in the form of a film is heated and pasted to form a photo resist layer having the thickness of 20–50 micron.

4. The method of manufacturing light-transmitting plates as claimed in claim 1 wherein the luminance distribution in the light-transmitting plate can be adjusted by varying the layer thickness of the photo resist applied on the flat substrate.

5. The method of manufacturing light-transmitting plates as claimed in claim 1, wherein a heat treatment process is added between the steps of developing the pattern and providing the metal layer to modify the topographical relief pattern formed in the photo resist.

6. The method of manufacturing light-transmitting plates as claimed in claim 1, wherein the exposing step includes exposing a photo mask in close proximity to the photo resist surface to light.

7. The method of manufacturing light-transmitting plates as claimed in claim 1, wherein the photo resist is applied on a flat substrate that has a surface which is roughened to provide a surface relief having peaks with a height that is less than said topographical relief pattern deflection element particular height.

* * * * *